(12) United States Patent
Song

(10) Patent No.: US 12,419,150 B2
(45) Date of Patent: Sep. 16, 2025

(54) SEMICONDUCTOR LIGHT-EMITTING ELEMENT AND DISPLAY DEVICE USING SAME

(71) Applicant: LG ELECTRONICS INC., Seoul (KR)

(72) Inventor: Hooyoung Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/928,821

(22) PCT Filed: Jun. 1, 2020

(86) PCT No.: PCT/KR2020/007072
§ 371 (c)(1),
(2) Date: Nov. 30, 2022

(87) PCT Pub. No.: WO2021/246537
PCT Pub. Date: Dec. 9, 2021

(65) Prior Publication Data
US 2023/0216004 A1  Jul. 6, 2023

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC .. H10H 20/857; H10H 20/0364; H10H 20/84; H10H 20/819; H10H 20/8314;
(Continued)

(56) References Cited

U.S. PATENT DOCUMENTS 8,129,727 B2 * 3/2012 Jeong ............... H10H 29/10
257/86
9,831,222 B2 * 11/2017 Lee ................. H10H 20/018
(Continued)

FOREIGN PATENT DOCUMENTS

JP   2011-187958 A    9/2011
KR   10-0809220 B1    2/2008
(Continued)

*Primary Examiner* — Victor A Mandala
(74) *Attorney, Agent, or Firm* — Birch, Stewart, Kolasch & Birch, LLP

(57) ABSTRACT

Discussed is a semiconductor light-emitting element that can include a body part including a first conductivity type semiconductor layer, an active layer on the first conductivity type semiconductor layer, and a second conductivity type semiconductor layer on the active layer, an insulating part covering at least a side surface of the body part, and an electrode part including a first conductivity type electrode in contact with the first conductivity type semiconductor layer, and a second conductivity type electrode in contact with the second conductivity type semiconductor layer, wherein the second conductivity type electrode includes a first portion on the second conductivity type semiconductor layer, and a second portion extending from the first portion and covering at least a portion of the insulating part, and the second portion protrudes further, with respect to the side surface of the body part, than the first conductivity type electrode.

16 Claims, 13 Drawing Sheets

(58) Field of Classification Search
CPC ................ H10H 20/833; H10H 29/142; H01L 25/0753; H10D 86/441
See application file for complete search history.

(56) References Cited

U.S. PATENT DOCUMENTS

| | | | | |
|---|---|---|---|---|
| 11,322,486 | B2* | 5/2022 | Jeon | H10H 20/857 |
| 11,476,299 | B2* | 10/2022 | Xu | H10H 20/814 |
| 11,532,775 | B2* | 12/2022 | Liu | H10H 20/857 |
| 2006/0154393 | A1* | 7/2006 | Doan | H10H 20/018 |
| | | | | 438/26 |
| 2006/0278886 | A1* | 12/2006 | Tomoda | H10H 20/841 |
| | | | | 257/E33.059 |
| 2008/0006836 | A1* | 1/2008 | Lee | H10H 20/8316 |
| | | | | 257/E33.068 |
| 2009/0173952 | A1* | 7/2009 | Takeuchi | H10H 20/018 |
| | | | | 438/26 |
| 2009/0267096 | A1* | 10/2009 | Kim | H10H 20/018 |
| | | | | 257/98 |
| 2009/0309514 | A1* | 12/2009 | Kim | H10H 20/857 |
| | | | | 257/E33.059 |
| 2016/0099383 | A1 | 4/2016 | Yuh | |
| 2017/0104009 | A1 | 4/2017 | Peng et al. | |
| 2018/0040822 | A1 | 2/2018 | Lin et al. | |
| 2018/0122788 | A1* | 5/2018 | Wu | H01L 25/167 |
| 2019/0123242 | A1* | 4/2019 | Tsao | H10D 86/40 |
| 2019/0363520 | A1* | 11/2019 | Laflaquiere | H01S 5/18305 |
| 2020/0168777 | A1* | 5/2020 | Kang | H10H 20/857 |
| 2020/0212267 | A1* | 7/2020 | Kwak | H10H 20/854 |
| 2022/0399313 | A1 | 12/2022 | Park et al. | |
| 2024/0088197 | A1* | 3/2024 | Jang | H10H 20/01335 |
| 2024/0421248 | A1* | 12/2024 | Li | H10H 29/142 |

FOREIGN PATENT DOCUMENTS

| | | |
|---|---|---|
| KR | 10-2017-0133717 A | 12/2017 |
| KR | 10-2019-0121274 A | 10/2019 |

* cited by examiner (a)

(b)

ETCHING

SEMICONDUCTOR LIGHT-EMITTING ELEMENT AND DISPLAY DEVICE USING SAME

CROSS REFERENCE TO RELATED APPLICATIONS

This application is the National Stage filing under 35 U.S.C. 371 of International Application No. PCT/KR2020/007072 filed on Jun. 1, 2020, which is hereby expressly incorporated by reference into the present application.

TECHNICAL FIELD

The present disclosure relates to a semiconductor light emitting device having a size of several µm and a display device using the same.

BACKGROUND ART

Recently, in order to implement a large-area display in the fields of display technologies, liquid crystal displays (LCD), organic light emitting diode displays (OLEDs), and micro LED displays are in competition.

Among them, a display using a semiconductor light emitting device (micro LED) having a diameter or cross-sectional area of 100 µm or less may provide very high efficiency because the display does not absorb light using a polarizing plate or the like.

The micro LED is transferred to a substrate through pick & place, laser lift-off (LLO), or self-assembly and then is bonded to the substrate in a manner such as wiring, solder, eutectic, sintering, and the like.

However, the above-described bonding methods are performed to bond semiconductor light emitting devices, each of which has a diameter or cross-sectional area of several tens of µm, and thus, there is a limit to being applied to the micro LED having a diameter or cross-sectional area of several µm as it is.

DISCLOSURE OF THE INVENTION

Technical Problem

An object of the present disclosure is to provide a semiconductor light emitting device having a size of several µm, which has a structure capable of being coupled to a substrate on which a wiring is disposed in a novel manner, and a display device constituted by the above-described semiconductor light emitting devices.

Technical Solution

A semiconductor light emitting device according to the present disclosure includes: a body part including a first conductivity type semiconductor layer, an active layer disposed on the first conductivity type semiconductor layer, and a second conductivity type semiconductor layer disposed on the active layer; an insulating part disposed to cover at least a side surface of the body part; and an electrode part including a first conductivity type electrode disposed to be in contact with the first conductivity type semiconductor layer of the body part, and a second conductivity type electrode disposed to be in contact with the second conductivity type semiconductor layer, wherein the second conductivity type electrode includes: a first portion disposed on the second conductivity type semiconductor layer; and a second portion disposed to extend from the first portion and cover at least a portion of the insulating part, wherein the second portion protrudes more than the first conductivity type electrode with respect to a side of the body part.

In this embodiment, the first portion may be made of a transparent material, and the second portion may be made of a metal material.

In this embodiment, the second conductivity type electrode may include a connection portion configured so that the first portion and the second portion overlap each other at a boundary therebetween.

In this embodiment, the connection portion may be configured so that the second portion covers a portion of a top surface of the first portion.

In this embodiment, the second conductivity type semiconductor layer may include: a first area on which the first portion of the second conductivity type electrode is disposed; and a second area on which the insulating layer is disposed and which surrounds the first area.

In this embodiment, the first portion may extend on the insulating layer disposed on the second area.

A display device according to the present disclosure includes: a substrate on which a wiring electrode is disposed; and semiconductor light emitting devices disposed on the substrate, wherein each of the semiconductor light emitting devices includes: a body part including a first conductivity type semiconductor layer, an active layer disposed on the first conductivity type semiconductor layer, and a second conductivity type semiconductor layer disposed on the active layer; an insulating part disposed to cover at least a side surface of the body part; and an electrode part including a first conductivity type electrode disposed to be in contact with the first conductivity type semiconductor layer of the body part, and a second conductivity type electrode disposed to be in contact with the second conductivity type semiconductor layer, wherein the second conductivity type electrode includes: a first portion disposed on the second conductivity type semiconductor layer; and a second portion disposed to extend from the first portion and cover at least a portion of the insulating part, wherein the second portion protrudes more than the first conductivity type electrode with respect to a side of the body part.

In this embodiment, the first portion may be made of a transparent material, and the second portion may be made of a metal material.

In this embodiment, the wiring electrode may include: a first wiring electrode electrically connected to the first conductivity type electrode; and a second wiring electrode disposed to be spaced a predetermined distance from the first wiring electrode at each of both sides of the first wiring electrode and electrically connected to the second conductivity type electrode.

In this embodiment, the first conductivity type electrode may be disposed on the first wiring electrode, and the second conductivity type electrode may be configured so that a portion of the second portion is disposed between the second wiring electrodes disposed at both the sides of the first wiring electrode.

In this embodiment, the second portion may further include a bent portion that is bent in a direction toward the second wiring electrode.

In this embodiment, the second wiring electrode may further include an auxiliary electrode covering the bent portion.

In this embodiment, the second portion may protrude more than the first conductivity type electrode by a thickness of at least the wiring electrode.

Advantageous Effects

According to the present disclosure, the n-electrode and the p-electrode of the semiconductor light emitting device may be simultaneously connected to the wiring electrode of the substrate during the one-time transfer through the structure in which the electrode extends to the side of the body in the vertical type semiconductor light emitting device. In addition, the gap with the wiring electrode may be covered by adjusting the length of the electrode extending to the side of the body part, and the bonding area with the wiring electrode may increase.

MODE FOR CARRYING OUT THE INVENTION

Hereinafter, embodiments disclosed in this specification is described with reference to the accompanying drawings, and the same or corresponding components are given with the same drawing number regardless of reference number, and their duplicated description will be omitted. The suffixes "module" and "unit" for components used in the description below are assigned or mixed in consideration of easiness in writing the specification and do not have distinctive meanings or roles by themselves. Moreover, in description of embodiments disclosed in this specification, detailed descriptions related to well-known functions or configurations will be ruled out in order not to unnecessarily obscure subject matters of the present disclosure. In addition, the accompanying drawings are only for easy understanding of the embodiments disclosed in the present specification, and should not be construed as limiting the technical spirit disclosed in the present specification by the accompanying drawings. In the following description, it will be understood that when an element such as a layer, a region, or substrate is referred to as being 'on' another layer, region, or substrate, it can be directly on the other layer, region, or substrate, or intervening layers, regions, or substrates may also be present.

A display device described in this specification includes a mobile phone, a smart phone, a laptop computer, a digital broadcasting terminal, a personal digital assistant (PDA), a portable multimedia player (PMP), a navigation system, a slate PC, a tablet PC, an ultrabook, a digital TV, a desktop computer, and the like. However, the configuration according to an embodiment described in this specification may be applied as long as the configuration includes a display even in a new product form to be developed later.

Figure 1:
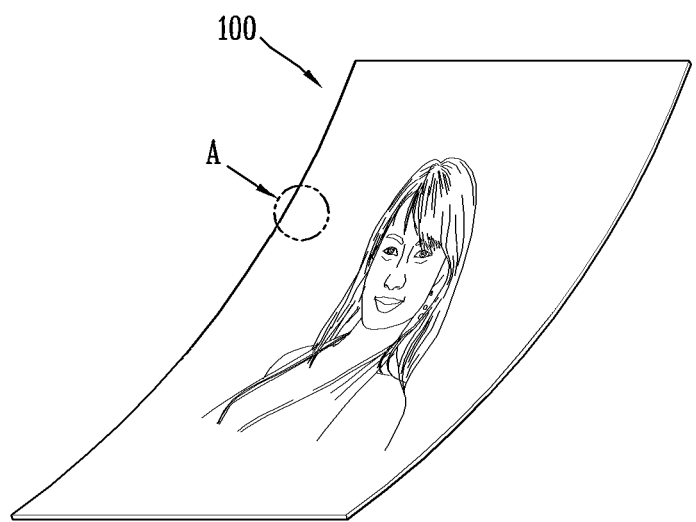
FIG. 1 is a conceptual view of a display device using a semiconductor light emitting device according to an embodiment of the present disclosure.

FIG. 1 is a conceptual view of a display device using a semiconductor light emitting device according to an embodiment of the present disclosure.

As illustrated in the drawings, information processed by a controller of a display device 100 may be displayed on a flexible display. The flexible display includes a display that is capable of being bent, curved, twisted, folded, or rolled by external force. For example, the flexible display may be a display manufactured on a thin and flexible substrate that is capable of being bent, curved, folded, or rolled like paper while maintaining the display characteristics of a conventional flat panel display.

In a state in which the flexible display is not bent (e.g., a state having an infinite radius of curvature, hereinafter referred to as a 'first state'), a display area of the flexible display becomes a flat surface. In a state in which the first state is deformed into a bent state by external force (for example, the flexible display has a limited radius of curvature, and hereinafter, referred to as a second state), the display area may have a curved surface. As illustrated in the drawing, information displayed in the second state may be visual information that is outputted on the curved surface. The visual information may be realized by independently controlling emission of sub-pixels arranged in the matrix form. The sub-pixel may represent a minimum unit for realizing one color.

The sub-pixel of the flexible display may be implemented by a semiconductor light emitting device. In the present disclosure, a light emitting diode (LED) is exemplified as a type of a semiconductor light emitting device that converts current into light. The light emitting diode may have a small size and thus serve as a sub-pixel even in the second state.

Hereinafter, the flexible display implemented using the light emitting diode will be described in more detail with reference to the accompanying drawings.

Figure 2:
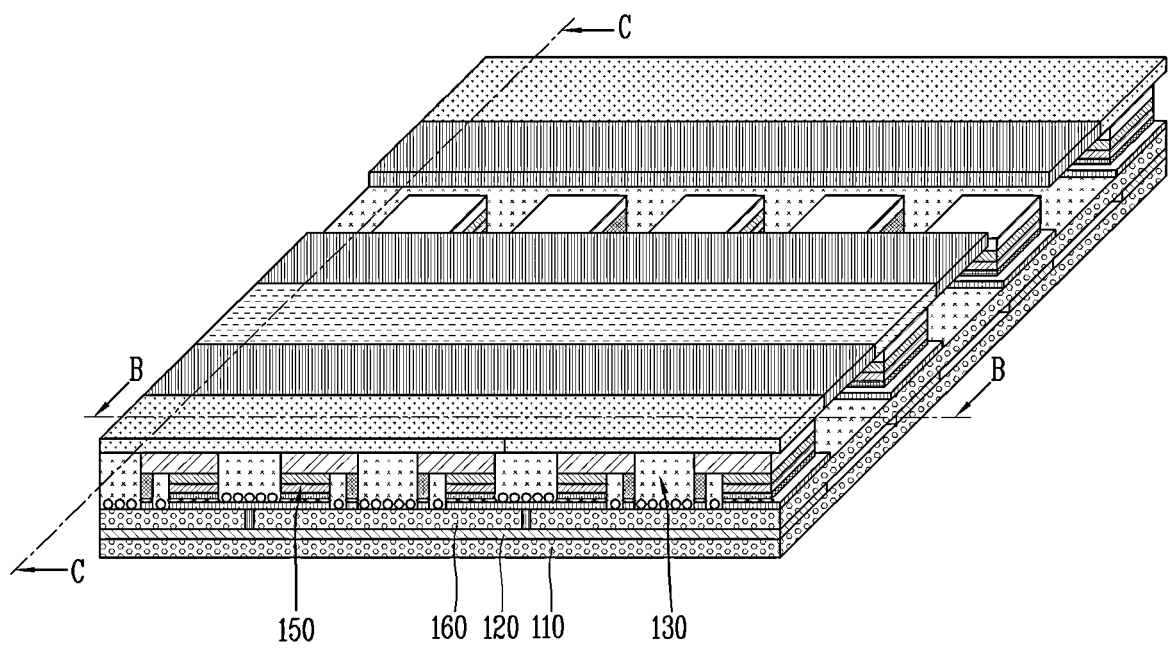
FIG. 2 is a partial enlarged view illustrating a portion A of the display device of FIG. 1, and FIGS. 3a and 3b are cross-sectional views taken along lines BB and CC of FIG. 2, respectively.
Figure 3A:
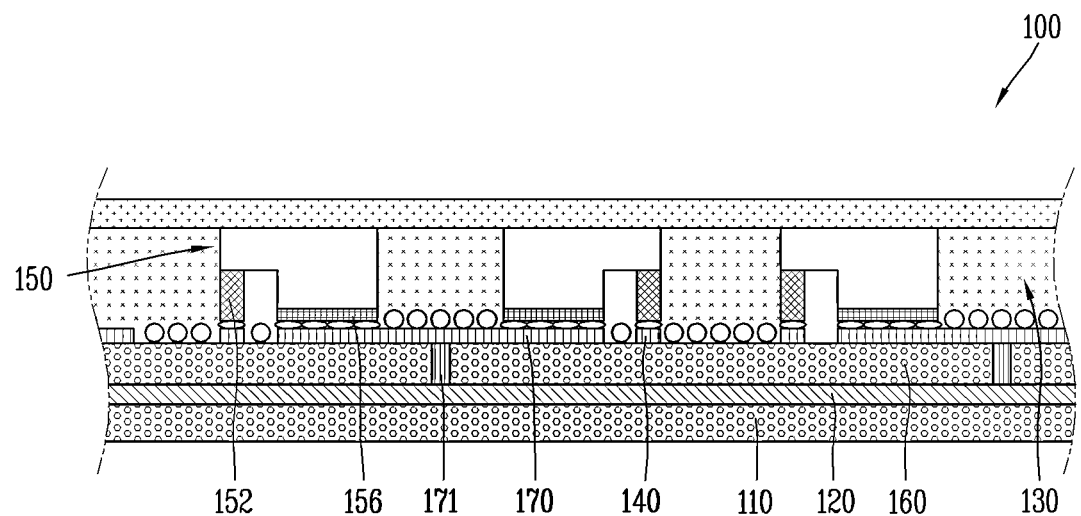
Figure 3B:
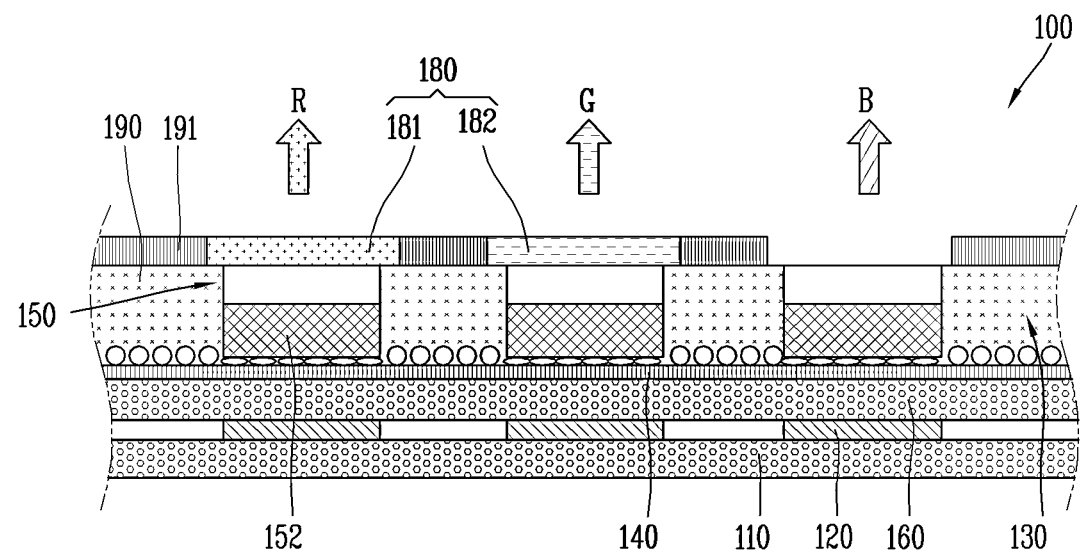
Figure 4:
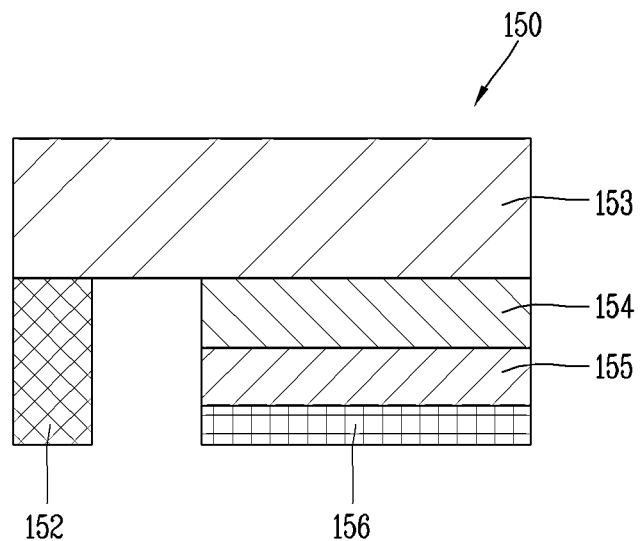
FIG. 4 is a conceptual view illustrating a flip-chip type semiconductor light emitting device of FIG. 3.

FIG. 2 is a partial enlarged view illustrating a portion A of the display device of FIG. 1, and FIGS. 3a and 3b are cross-sectional views taken along lines BB and CC of FIG. 2, respectively, FIG. 4 is a conceptual view illustrating a flip-chip type semiconductor light emitting device of FIG. 3, and FIGS. 5a to 5c are conceptual views illustrating various shapes that implement colors in relation to the flip-chip type semiconductor light emitting device.

FIGS. 2, 3a, and 3b illustrate a display device 100 using a passive matrix (PM) type semiconductor light emitting device as a display device 100 using a semiconductor light emitting device. However, examples described below are also applicable to an active matrix (AM) type semiconductor light emitting device.

The display device 100 includes a substrate 110, a first electrode 120, a conductive adhesive layer 130, a second electrode 140, and a plurality of semiconductor light emitting devices 150.

The substrate 110 may be a flexible substrate. The substrate 110 may include glass or polyimide (PI) to realize flexible performance. In addition, an insulating and flexible material such as polyethylene naphthalate (PEN) or polyethylene terephthalate (PET) may be used as a component of the substrate 110. In addition, the substrate 110 may be any of a transparent material or an opaque material.

The substrate 110 may be a wiring substrate on which the first electrode 120 is disposed, and the first electrode 120 may be disposed on the substrate 110.

As illustrated in the drawings, the insulating layer 160 may be stacked on the substrate 110 on which the first electrode 120 is disposed, and an auxiliary electrode 170 may be disposed on the insulating layer 160. In this case, the state in which the insulating layer 160 is stacked on the substrate 110 may be a single wiring substrate. More specifically, the insulating layer 160 may be made of an insulating and flexible material such as PI, PEN, PET, etc., and be integrated with the substrate 110 to form a single wiring substrate.

The auxiliary electrode 170 may be an electrode electrically connecting the first electrode 120 to the semiconductor light emitting device 150 and be disposed on the insulating layer 160 to correspond to a position of the first electrode 120. For example, the auxiliary electrode 170 may have a dot shape and may be electrically connected to the first electrode 120 by an electrode hole 171 passing through the insulating layer 160. The electrode hole 171 may be defined by filling the via hole with a conductive material.

According to the accompanying drawings, the conductive adhesive layer 130 is disposed on one surface of the insulating layer 160, but the present disclosure is not necessarily limited thereto. For example, a layer performing a specific function may be disposed between the insulating layer 160 and the conductive adhesive layer 130, and a structure in which the conductive adhesive layer 130 is disposed on a substrate without the insulating layer 160 may be also possible. In a structure in which the conductive adhesive layer 130 is disposed on the substrate, the conductive adhesive layer 130 may serve as the insulating layer.

The conductive adhesive layer 130 may be a layer having adhesiveness and conductivity, and for this purpose, the conductive adhesive layer 130 may be provided by mixing a material having conductivity with a material having adhesiveness. In addition, the conductive adhesive layer 130 has flexibility to enable a flexible function in the display device.

For example, the conductive adhesive layer 130 may be an anisotropy conductive film (ACF), an anisotropic conductive paste, a solution containing conductive particles, or the like. The conductive adhesive layer 130 may allow electrical interconnection in a z-direction passing through a thickness, but may be configured as an electrically insulating layer in a horizontal x-y direction. Thus, the conductive adhesive layer 130 may be referred to as a z-axis conductive layer (however, hereinafter, referred to as a 'conductive adhesive layer').

The anisotropic conductive film may be a film in which an anisotropic conductive medium is mixed with an insulating base member and may have conductivity at a specific portion due to the anisotropic conductive medium when heat and a pressure are applied. In this specification, it is described that the heat and pressure are applied to the anisotropic conductive film, but in order for the anisotropic conductive film having the partial conductivity, another method (for example, a method in which only one of the heat and pressure is applied, or an UV curing method) may be used.

In addition, the anisotropic conductive medium may be a conductive ball or conductive particles. As illustrated in the drawings, the anisotropic conductive film may be a film in which the conductive balls are mixed with the insulating base member and may have conductivity at only a specific portion of the conductive balls when the heat and pressure are applied. The anisotropic conductive film may be in a state in which particles, each of which has a shape in which a core of a conductive material is covered with an insulating film made of a polymer material, are contained. In this case, an insulating film of each of the particles contained in the portion to which the heat and pressure is applied may be destroyed and thus have the conductivity by the core. Here, the shape of the core may be deformed to form layers that are in contact with each other in a thickness direction of the film. More specifically, the heat and pressure may be applied as a whole to the anisotropic conductive film, and an electrical connection in a z-axis direction may be partially provided by a height difference of an object adhering by the anisotropic conductive film.

As another example, the anisotropic conductive film may be in a state in which an insulating core contains a plurality of particles coated with a conductive material. In this case, the conductive material at the portion to which the heat and pressure is applied may be deformed (stick) and thus have conductivity in the thickness direction of the film. As another example, a form in which the conductive material passes through the insulating base member in the z-axis direction to have conductivity in the thickness direction of the film is also possible, and in this case, the conductive material may have a pointed end.

As illustrated in the drawings, the anisotropic conductive film may be a fixed array anisotropic conductive film (ACF) in which the conductive balls are inserted into one surface of the insulating base member. The insulating base member may be made of a material having an adhesive property, and the conductive balls may be intensively disposed on a bottom portion of the insulating base member so that when the heat and pressure are applied from the base member, the conductive balls are deformed together with the conductive balls to have conductivity in the vertical direction.

However, the present disclosure is not necessarily limited thereto, and the anisotropic conductive film may selectively have all of a form in which the conductive balls are randomly mixed in an insulating base member and a form in which the conductive balls are made of a plurality of layers and are arranged on one layer (double-ACF).

The anisotropic conductive paste may be a combination of the paste and the conductive ball and may be paste in which the conductive balls are mixed with the insulating and adhesive base material. In addition, the solution containing the conductive particles may be a solution containing conductive particles or nanoparticles.

Referring to the accompanying drawings, the second electrode 140 is spaced apart from the auxiliary electrode 170 and is disposed on the insulating layer 160. That is, the conductive adhesive layer 130 is disposed on the insulating layer 160 in which the auxiliary electrode 170 and the second electrode 140 are disposed.

After the conductive adhesive layer 130 is formed in a state in which the auxiliary electrode 170 and the second electrode 140 are disposed on the insulating layer 160, the heat and pressure are applied to connect the semiconductor light emitting device 150 in a flip-chip form, the semiconductor light emitting device 150 is electrically connected to the first electrode 120 and the second electrode 140.

The semiconductor light emitting device 150 may be a flip chip type light emitting device as illustrated in FIG. 4.

For example, the semiconductor light emitting device 150 includes a p-type electrode 156, a p-type semiconductor layer 155 in which the p-type electrode 156 is provided, an active layer 154 disposed on the p-type semiconductor layer 155, an n-type semiconductor layer 153 disposed on the active layer 154, and an n-type electrode 152 disposed to be spaced horizontally from the p-type electrode 156 on the n-type semiconductor layer 153. In this case, the p-type electrode 156 may be electrically connected to the auxiliary electrode 170 by the conductive adhesive layer 130, and the n-type electrode 152 may be electrically connected to the second electrode 140 by the conductive adhesive layer 130.

Referring to FIGS. 2, 3a and 3b, the auxiliary electrode 170 may be disposed to be elongated in one direction so that one auxiliary electrode 170 is electrically connected to the plurality of semiconductor light emitting devices 150. For example, the p-type electrodes 156 of the semiconductor light emitting devices 150 at left and right side with the auxiliary electrode 170 as a center may be electrically connected to one auxiliary electrode.

Specifically, the semiconductor light emitting device 150 may be press-fitted into the conductive adhesive layer 130 by the heat and pressure, and thus, the semiconductor light emitting device 150 may have conductivity at only a portion between the p-type electrode 156 and the auxiliary electrode 170 of the semiconductor light emitting device 150 and a portion between the n-type electrode 152 and the second electrode 140 of the semiconductor light emitting device 150, and there is no conductivity at the remaining portion without the press-fitting of the semiconductor light emitting device 150. As described above, the conductive adhesive layer 130 may electrically connect as well as mutually couple between the semiconductor light emitting device 150 and the auxiliary electrode 170 and between the semiconductor light emitting device 150 and the second electrode 140.

In addition, the plurality of semiconductor light emitting devices 150 constitute a light emitting device array, and a phosphor layer 180 is disposed on the light emitting device array.

The light emitting device array may include a plurality of semiconductor light emitting devices 150 having different luminance values. Each of the semiconductor light emitting devices 150 constitutes a sub-pixel and is electrically connected to the first electrode 120. For example, the first electrode 120 may be provided in plurality, the semiconductor light emitting devices 150 may be arranged in several columns, and the semiconductor light emitting devices 150 in each column may be electrically connected to any one of the plurality of first electrodes 120.

In addition, since the semiconductor light emitting devices 150 are connected in a flip-chip form, the semiconductor light emitting devices 150 grown on a transparent dielectric substrate may be used. The semiconductor light emitting devices 150 may be, for example, nitride semiconductor light emitting devices. Since the semiconductor light emitting device 150 has excellent luminance, each of individual sub-pixels may be configured even with a small size.

Referring to the drawings, a partitioning wall 190 may be disposed between the semiconductor light emitting devices 150. In this case, the partitioning wall 190 may serve to separate the individual sub-pixels from each other and may be integrated with the conductive adhesive layer 130. For example, the semiconductor light emitting device 150 may be inserted into the anisotropic conductive film, and thus, the base member of the anisotropic conductive film may provide the partitioning wall 190.

In addition, when the base member of the anisotropic conductive film has a black color, the partitioning wall 190 may have reflective properties and increase in contrast even without a separate black insulator.

As another example, a separate reflective partitioning wall may be provided as the partitioning wall 190. In this case, the partitioning wall 190 may include a black or white insulator depending on the purpose of the display device. When the partitioning wall 190 made of the white insulator is used, the partitioning wall 190 may have improved reflectivity, and when the partitioning wall 190 made of the black insulator is used, the partitioning wall 190 may have reflective properties and also increase in contrast ratio.

The phosphor layer 180 may be disposed on an outer surface of the semiconductor light emitting device 150. For example, when the semiconductor light emitting device 150 is a blue semiconductor light emitting device emitting blue (B) light, the phosphor layer 180 may perform a function of converting the blue (B) light into a color of the sub-pixel. The phosphor layer 180 may be a red phosphor 181 or a green phosphor 182 constituting the individual pixel.

That is, a red phosphor 181 capable of converting blue (B) light into red (R) light may be stacked on the blue semiconductor light emitting device 151 at a position at which a red sub-pixel is defined, and a green phosphor 182 capable of converting blue (B) light into green (G) light may be stacked on the blue semiconductor light emitting device 151 at a position at which a green sub-pixel is defined. In addition, only the blue semiconductor light emitting device 151 may be used alone at a portion constituting the blue sub-pixel. In this case, the sub-pixels having red (R), green (G), and blue (B) colors may form one pixel. Specifically, the phosphor 180 having one color may be stacked along each line of the first electrode 120, and thus, one line in the first electrode 120 may be an electrode that controls one color. That is, the red (R), green (G), and blue (B) colors may be sequentially disposed along the second electrode 140, and the sub-pixel may be implemented.

However, the present disclosure is not necessarily limited thereto, and instead of the phosphor 180, the semiconductor light emitting device 150 and the quantum dot QD may be combined to implement red (R), green (G) and blue (B) sub-pixels.

In addition, a black matrix 191 may be disposed between the phosphor layers 180 to improve contrast of light and dark.

However, the present disclosure is not necessarily limited thereto, and other structures for implementing the blue, red, and green colors may be applied.

Figure 5A:
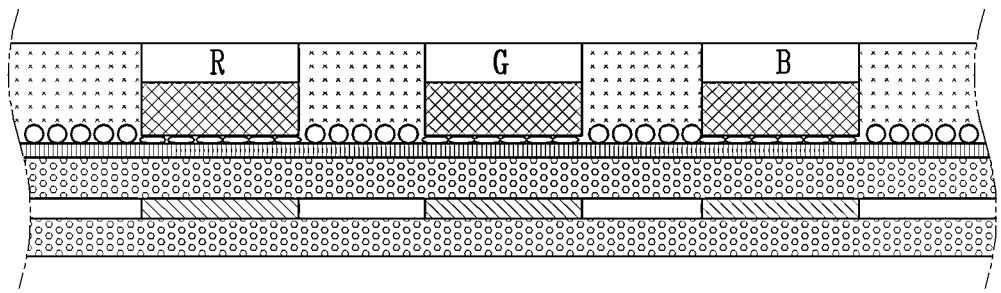
FIGS. 5a to 5c are conceptual views illustrating various shapes that implement colors in relation to the flip-chip type semiconductor light emitting device.

Referring to FIG. 5a, the semiconductor light emitting device 150 may be mainly made of gallium nitride (GaN) and be added with indium (In) and/or aluminum (Al) so as to be implemented as a high-power light emitting device that emits various light in addition to the blue light.

In this case, the semiconductor light emitting device 150 may include red, green, and blue semiconductor light emitting devices to form each sub-pixel. For example, the red, green, and blue semiconductor light emitting devices R, G, and B may be alternately disposed, and the sub-pixels having the red, green, and blue colors may be provided as one pixel by the red, green, and blue semiconductor light emitting devices, and thus, a full-color display may be realized.

Figure 5B:
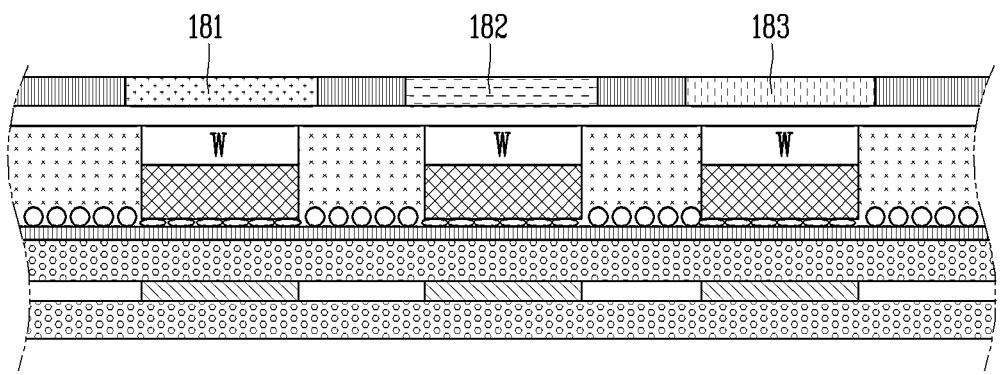

Referring to FIG. 5b, the semiconductor light emitting device 150 may be a white light emitting device W in which a yellow phosphor layer is provided for each individual element. In this case, a red phosphor layer 181, a green phosphor layer 182, and a blue phosphor layer 183 may be provided on the white light emitting device W to form the sub-pixel. In addition, the sub-pixel may be provided on the white light emitting device W by using a color filter in which red, green, and blue colors are repeated.

Figure 5C:
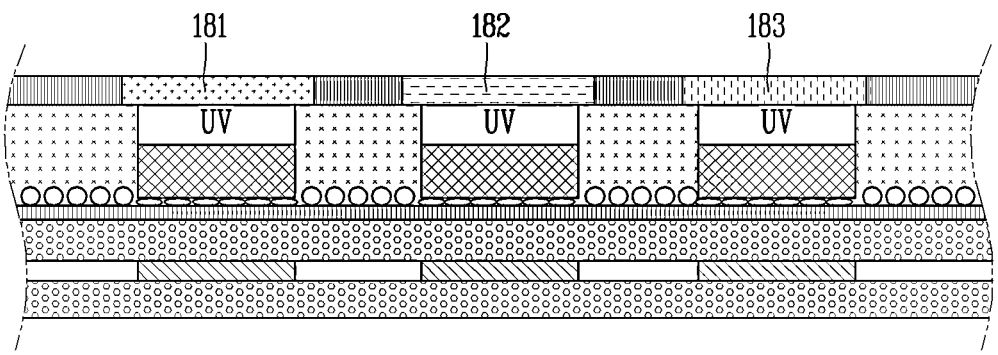

Referring to FIG. 5c, the red phosphor layer 181, the green phosphor layer 182, and the blue phosphor layer 183 may be provided on an ultraviolet light emitting device W. As described above, the semiconductor light emitting device 150 may be used not only in the visible ray region, but also in the entire region including ultraviolet rays, and may be extended in the form of the semiconductor light emitting device in which the ultraviolet rays are used as an excitation source of an upper phosphor.

Referring again to this example, the semiconductor light emitting device 150 is disposed on the conductive adhesive layer 130 to constitute the sub-pixel in the display device. Since the semiconductor light emitting device 150 has excellent luminance, each of individual sub-pixels may be configured even with a small size. The individual semiconductor light emitting device 150 may be a rectangular or square element having a side length of 80 μm or less. In the case of the rectangular semiconductor light emitting device 150 may have a size of 20×80 μm or less.

In addition, even when the square semiconductor light emitting device 150 having a side length of 10 μm is used as the sub-pixel, sufficient brightness to implement the display device may be realized. Therefore, for example, when the sub-pixel is a rectangular pixel having one side of 600 μm and the other side of 300 μm, a distance between the semiconductor light emitting devices 150 is relatively large enough to realize a flexible display device having HD quality.

The display device using the semiconductor light emitting device described above may be manufactured by a new type of manufacturing method. Hereinafter, the manufacturing method will be described with reference to FIG. 6.

Figure 6:
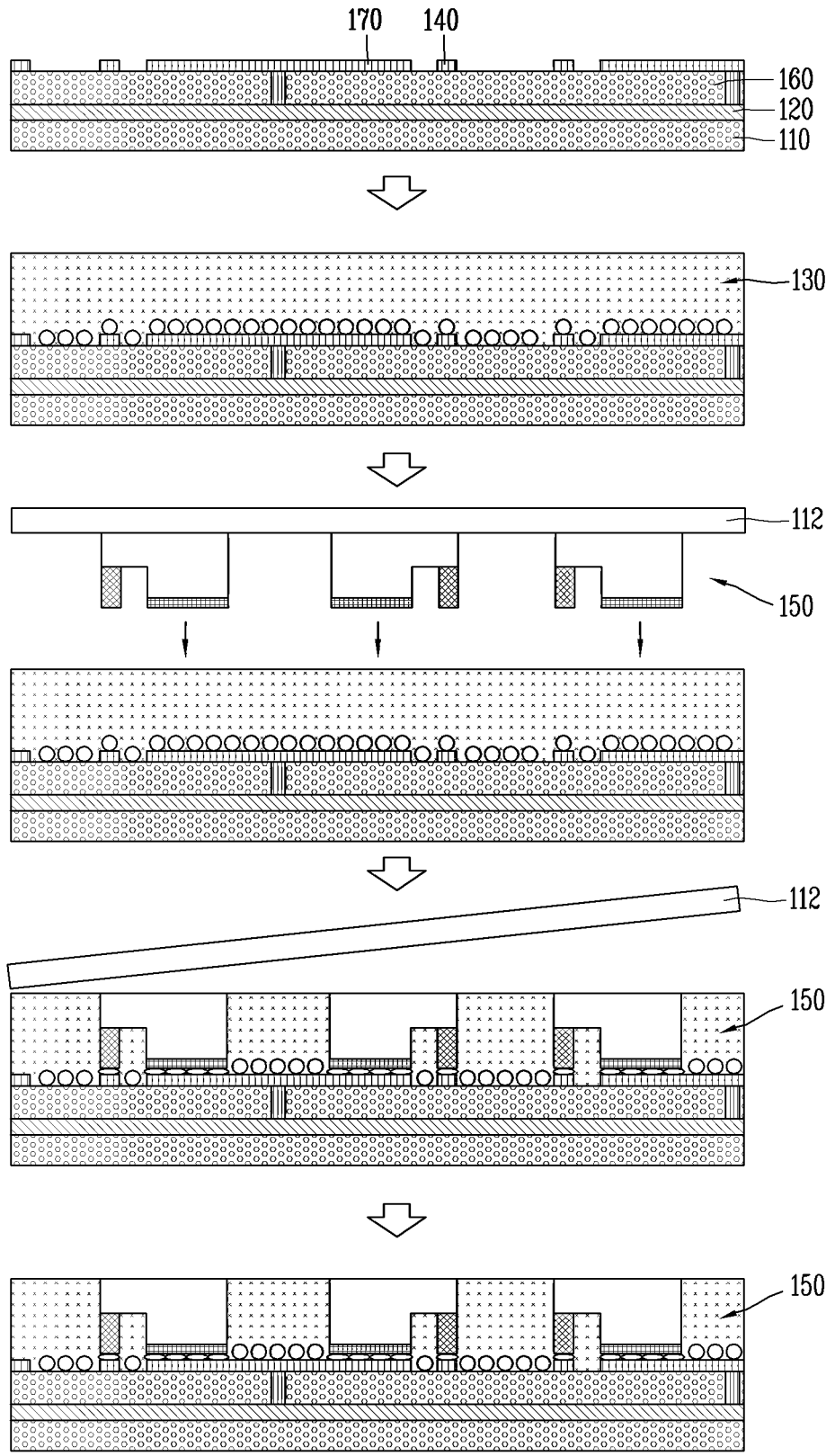
FIG. 6 is cross-sectional views illustrating a method for manufacturing a display device using a semiconductor light emitting device of the present disclosure.

Referring to FIG. 6, first, a conductive adhesive layer 130 is formed on the insulating layer 160 on which the auxiliary electrode 170 and the second electrode 140 are disposed. The insulating layer 160 is stacked on a first substrate 110 to form one substrate (or a wiring substrate), and a first electrode 120, an auxiliary electrode 170, and a second electrode 140 are disposed on the wiring substrate. The first electrode 120 and the second electrode 150 may be disposed in a direction perpendicular to each other. In addition, in order to implement the flexible display device, each of the first substrate 110 and the insulating layer 160 may include glass or polyimide (PI).

The conductive adhesive layer 130 may be implemented by an anisotropic conductive film, and for this purpose, the anisotropic conductive film may be applied to a substrate disposed on the insulating layer 160.

Next, a second substrate 112 which corresponds to positions of the auxiliary electrode 170 and the second electrodes 140 and on which the plurality of semiconductor light emitting devices 150 constituting the individual pixels are disposed is disposed so that the semiconductor light emitting device 150 faces the auxiliary electrode 170 and the second electrode 140.

In this case, the second substrate 112 may be a growth substrate, on which the semiconductor light emitting device 150 is grown, and may be a sapphire substrate or a silicon substrate.

The semiconductor light emitting device 150 may be effectively used in the display device by providing a gap and a size capable of forming the display device when formed in a wafer unit.

Next, the wiring substrate and the second substrate 112 are thermo-compression-bonded. For example, the wiring substrate and the second substrate 112 may be thermo-compression-bonded by applying an ACF press head. The wiring substrate and the second substrate 112 are bonded by the thermo-compression bonding. Due to the properties of the anisotropic conductive film having conductivity by the thermo-compression bonding, only a portion between the semiconductor light emitting device 150 and the auxiliary electrode 170 and the second electrode 140 may have conductivity, and the electrodes may be electrically connected to the semiconductor light emitting device 150. Here, the semiconductor light emitting device 150 may be inserted into the anisotropic conductive film, and thus, a partitioning wall may be formed between the semiconductor light emitting devices 150.

Next, the second substrate 112 is removed. For example, the second substrate 112 may be removed using a laser lift-off method (LLO) or a chemical lift-off method (CLO).

Finally, the second substrate 112 is removed to expose the semiconductor light emitting device 150 to the outside. If necessary, a transparent insulating layer (not shown) may be formed by applying silicon oxide ($SiO_x$) or the like on the wiring substrate to which the semiconductor light emitting device 150 is coupled.

In addition, the method may further include a process of forming a phosphor layer on one surface of the semiconductor light emitting device 150. For example, the semiconductor light emitting device 150 is a blue semiconductor light emitting device that emits blue (B) light, and a red or green phosphor for converting the blue (B) light into the color of the sub-pixel may form a layer on one surface of the blue semiconductor light emitting device.

The manufacturing method or structure of the display device using the semiconductor light emitting device described above may be modified and implemented in various forms. For example, the vertical type semiconductor light emitting device may be applied to the display device described above. Hereinafter, a vertical structure will be described with reference to FIGS. 5 and 6.

In addition, in the modified examples or embodiments described below, the same or similar reference numerals are assigned to the same or similar structures as the previous examples, and the description is substituted by the first description.

Figure 7:
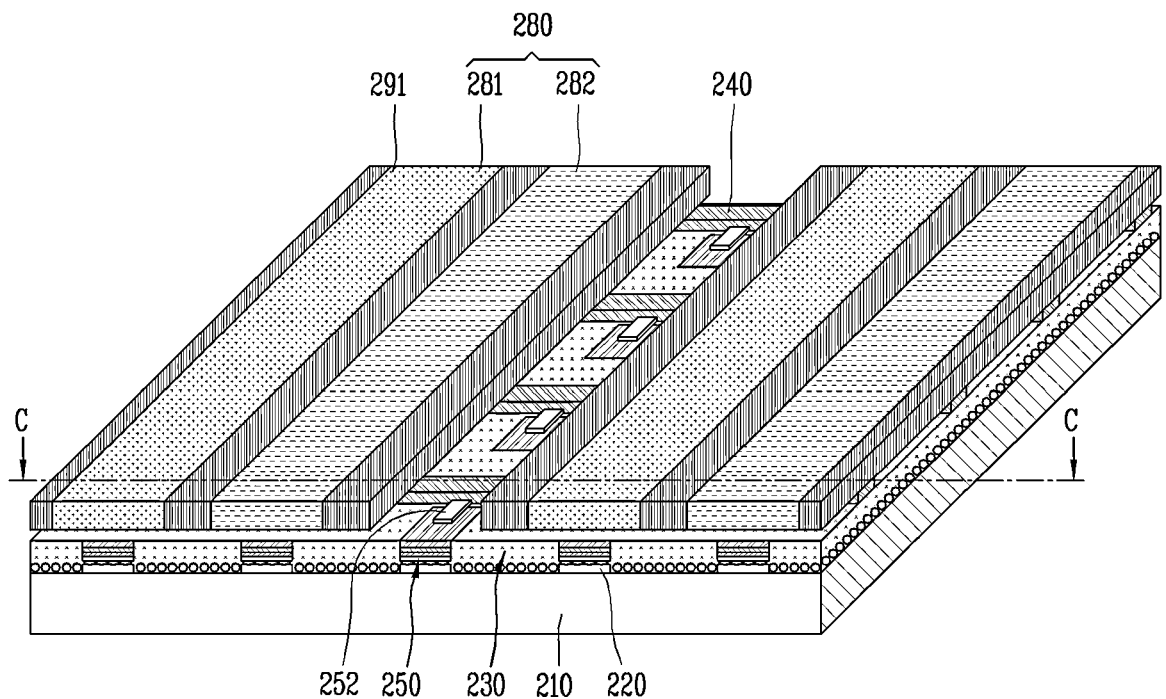
FIG. 7 is a perspective view of a display device using a semiconductor light emitting device according to another embodiment of the present disclosure.
Figure 8:
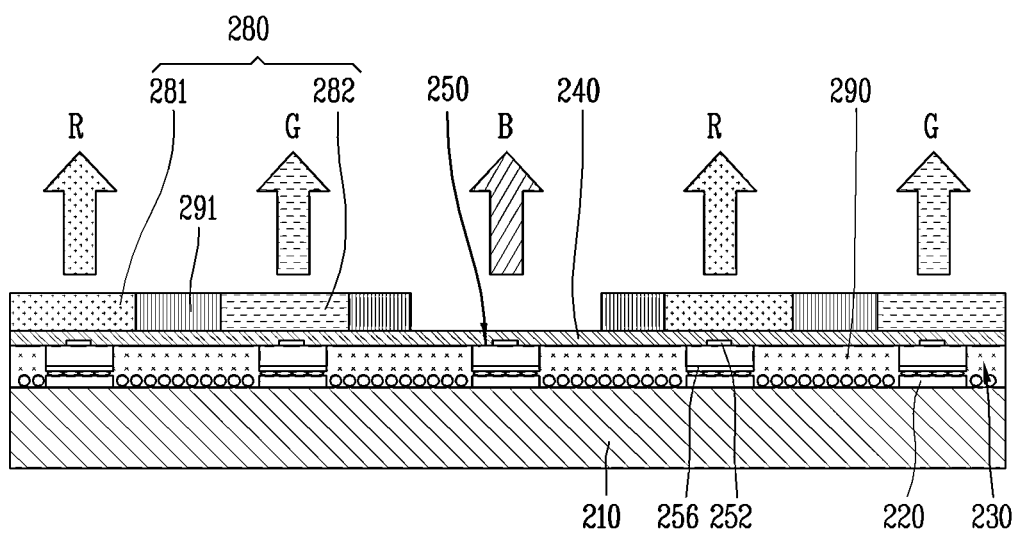
FIG. 8 is a cross-sectional view taken along line C-C of FIG. 7.
Figure 9:
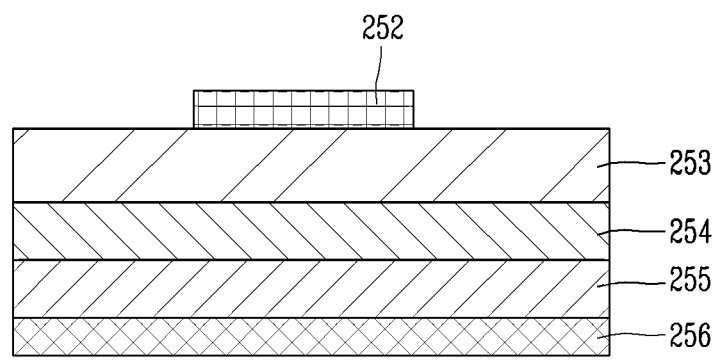
FIG. 9 is a conceptual view illustrating a vertical type semiconductor light emitting device of FIG. 8.

FIG. 7 is a perspective view of a display device using a semiconductor light emitting device according to another embodiment of the present disclosure, FIG. 8 is a cross-sectional view taken along line C-C of FIG. 7, and FIG. 9 is a conceptual view illustrating a vertical type semiconductor light emitting device of FIG. 8.

Referring to the drawings, a display device may be a display device using a passive matrix (PM) type vertical type semiconductor light emitting device.

The display device includes a substrate 210, a first electrode 220, a conductive adhesive layer 230, a second electrode 240, and a plurality of semiconductor light emitting devices 250.

The substrate 210 may be a wiring substrate on which the first electrode 220 is disposed and may include polyimide (PI) to implement a flexible display device. In addition, any insulating and flexible material may be used.

The first electrode 220 may be disposed on the substrate 210 and may be provided as a bar-shaped electrode long in one direction. The first electrode 220 may serve as a data electrode.

The conductive adhesive layer 230 is disposed on the substrate 210 on which the first electrode 220 is disposed. Like the display device to which the flip chip type light emitting device is applied, the conductive adhesive layer 230 may be an anisotropic conductive film (ACF), an anisotropic conductive paste, a solution containing conductive particles, or the like. However, in this embodiment as well, a case in which the conductive adhesive layer 230 is implemented by the anisotropic conductive film is exemplified.

When the semiconductor light emitting device 250 is connected by applying heat and a pressure after disposing the anisotropic conductive film on the substrate 210 in the state in which the first electrode 220 is disposed, the semiconductor light emitting device 250 may be electrically connected to the first electrode 220. In this case, the semiconductor light emitting device 250 is preferably disposed on the first electrode 220.

The electrical connection is created because, as described above, when the heat and pressure are applied to the anisotropic conductive film, the anisotropic conductive film has partial conductivity in the thickness direction. Thus, the anisotropic conductive film is divided into a conductive portion 231 and a non-conductive portion 232 in the thickness direction.

In addition, since the anisotropic conductive film contains an adhesive component, the conductive adhesive layer 230 implements not only the electrical connection but also mechanical bonding between the semiconductor light emitting device 250 and the first electrode 220.

As described above, the semiconductor light emitting device 150 is disposed on the conductive adhesive layer 130 to constitute a sub-pixel in the display device. Since the semiconductor light emitting device 150 has excellent luminance, each of individual sub-pixels may be configured even with a small size. The individual semiconductor light emitting device 150 may be a rectangular or square element having a side length of 80 µm or less. In the case of the rectangular semiconductor light emitting device 150 may have a size of 20×80 µm or less.

The semiconductor light emitting device 250 may have a vertical structure.

A plurality of second electrodes 240 are disposed in a direction crossing a longitudinal direction of the first electrode 220 and electrically connected to the vertical type semiconductor light emitting devices 250, respectively, is disposed between the vertical type semiconductor light emitting devices 250.

Referring to FIG. 9, the vertical type semiconductor light emitting device includes a p-type electrode 256, a p-type semiconductor layer 255 disposed on the p-type electrode 256, an active layer 254 disposed on the p-type semiconductor layer 255, an n-type semiconductor layer 253 disposed on the active layer 254, and an n-type electrode 252 disposed on the n-type semiconductor layer 253. In this case, the lower p-type electrode 256 may be electrically connected to the first electrode 220 by the conductive adhesive layer 230, and the upper n-type electrode 252 may be electrically connected to a second electrode 240 to be described later. The vertical type semiconductor light emitting device 250 has a great advantage in that a size of a chip is reduced because the electrodes are arranged vertically.

Referring to FIG. 8, a phosphor layer 280 may be formed on one surface of the semiconductor light emitting device 250. For example, the semiconductor light emitting device 250 may be a blue semiconductor light emitting device 251 that emits blue (B) light, and the phosphor layer 280 for converting the blue (B) light into a color of a sub-pixel may be provided. In this case, the phosphor layer 280 may be a red phosphor 281 and a green phosphor 282 constituting the individual pixels.

That is, a red phosphor 281 capable of converting blue (B) light into red (R) light may be stacked on the blue semiconductor light emitting device 251 at a position at which a red sub-pixel is defined, and a green phosphor 282 capable of converting blue (B) light into green (G) light may be stacked on the blue semiconductor light emitting device 251 at a position at which a green sub-pixel is defined. In addition, only the blue semiconductor light emitting device 251 may be used alone at a portion constituting the blue sub-pixel. In this case, the sub-pixels having red (R), green (G), and blue (B) colors may form one pixel.

However, the present disclosure is not necessarily limited thereto, and as described above in a display device to which the flip chip type light emitting device is applied, other structures for realizing the blue, red, and green colors may be applied.

In this embodiment, the second electrode 240 is disposed between the semiconductor light emitting devices 250 and be electrically connected to the semiconductor light emitting devices 250. For example, the semiconductor light emitting devices 250 may be arranged in a plurality of columns, and the second electrode 240 may be disposed between the columns of the semiconductor light emitting devices 250.

Since a distance between the semiconductor light emitting devices 250 constituting the individual pixels is sufficiently large, the second electrode 240 may be disposed between the semiconductor light emitting devices 250.

The second electrode 240 may be provided as a long bar-shaped electrode in one direction and may be disposed in a direction perpendicular to the first electrode 220.

In addition, the second electrode 240 and the semiconductor light emitting device 250 may be electrically connected by an electrode protruding from the second electrode 240. Specifically, the connection electrode may be the n-type electrode 252 of the semiconductor light emitting device 250. For example, the n-type electrode 252 is provided as an ohmic electrode for ohmic contact, and the second electrode 240 covers at least a portion of the ohmic electrode by printing or deposition. Thus, the second electrode 240 and the n-type electrode 252 of the semiconductor light emitting device 250 may be electrically connected to each other.

As illustrated in the drawings, the second electrode 240 may be disposed on the conductive adhesive layer 230, and, if necessary, a transparent insulating layer (not shown) including silicon oxide ($SiO_x$) may be disposed on the substrate 210 on which the semiconductor light emitting device 250 is disposed. When the second electrode 240 is disposed after forming the transparent insulating layer, the second electrode 240 is disposed on the transparent insulating layer. In addition, the second electrode 240 may be disposed to be spaced apart from the conductive adhesive layer 230 or the transparent insulating layer.

When a transparent electrode such as indium tin oxide (ITO) is used to dispose the second electrode 240 on the semiconductor light emitting device 250, there is a problem in that the ITO material has poor adhesion to the n-type semiconductor layer 253. Thus, the present disclosure has an advantage in that it is not necessary to use the transparent electrode such as the ITO by disposing the second electrode 240 between the semiconductor light emitting devices 250. Therefore, light extraction efficiency may be improved by using the conductive material having good adhesion to the n-type semiconductor layer 253 as a horizontal electrode without being limited by the selection of the transparent material.

Referring to the drawings, a partitioning wall 290 may be disposed between the semiconductor light emitting devices 250. A partitioning wall 290 may be disposed between the vertical type semiconductor light emitting devices 250 to isolate the semiconductor light emitting devices 250 constituting the individual pixels. In this case, the partitioning wall 290 may serve to separate the individual sub-pixels from each other and may be integrated with the conductive adhesive layer 230. For example, the semiconductor light emitting device 250 may be inserted into the anisotropic conductive film, and thus, the base member of the anisotropic conductive film may provide the partitioning wall 290.

In addition, when the base member of the anisotropic conductive film has a black color, the partitioning wall 290 may have reflective properties and increase in contrast even without a separate black insulator.

As another example, the partitioning wall 290 may be separately provided with a reflective partitioning wall. The partitioning wall 290 may include a black or white insulator depending on the purpose of the display device.

If the second electrode 240 is directly disposed on the conductive adhesive layer 230 between the semiconductor light emitting devices 250, the partitioning wall 290 may be disposed between the vertical type semiconductor light emitting device 250 and the second electrode 240. Therefore, the individual sub-pixels may be configured even with a small size by using the semiconductor light emitting device 250, and a distance between the semiconductor light emitting devices 250 may be relatively large enough so that the second electrode 240 is disposed between the semiconductor light emitting devices 250, thereby implementing a flexible display device having HD image quality.

In addition, a black matrix 291 may be disposed between phosphors to improve contrast of light and dark.

As described above, the semiconductor light emitting device 250 is disposed on the conductive adhesive layer 230 to constitute the individual pixels in the display device. Since the semiconductor light emitting device 250 has excellent luminance, each of individual sub-pixels may be configured even with a small size. Thus, a full-color display in which the sub-pixels having the red (R), green (G), and blue (B) colors constitute one pixel may be implemented by the semiconductor light emitting device 250.

The present disclosure relates to an ultra-small semiconductor light emitting device having a size of several μm among semiconductor light emitting devices and a display device using the same.

Figure 10:
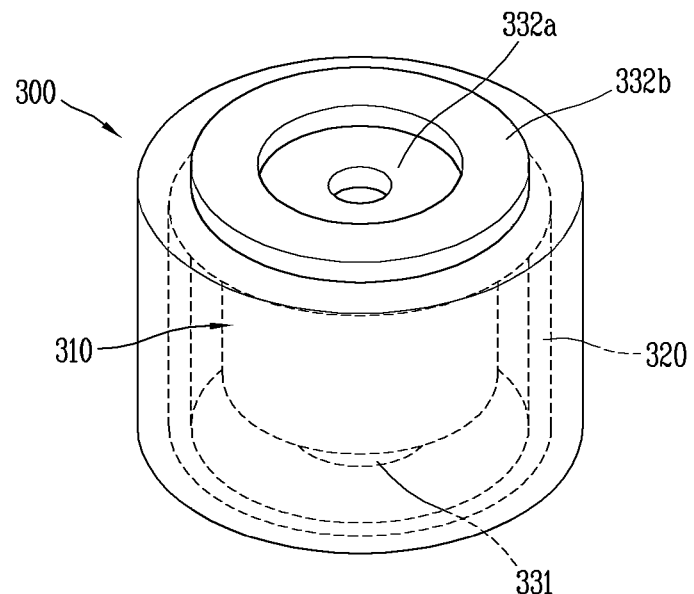
FIG. 10, including (a) and (b) are conceptual views of a semiconductor light emitting device according to the present disclosure.
Figure 10:
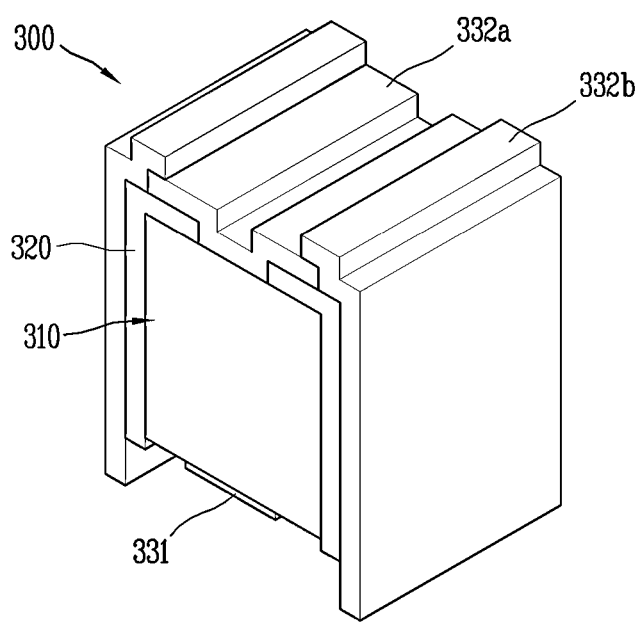
Figure 11:
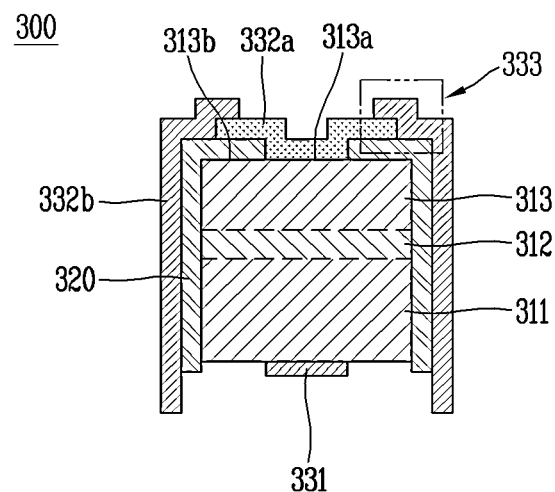
FIG. 11 is a cross-sectional view of the semiconductor light emitting device according to the present disclosure.

First, a semiconductor light emitting device according to the present disclosure will be described with reference to FIGS. 10 and 11. FIG. 10 is a conceptual view of a semiconductor light emitting device according to the present disclosure, and FIG. 11 is a cross-sectional view of the semiconductor light emitting device according to the present disclosure.

A semiconductor light emitting device 300 according to the present disclosure is an ultra-small semiconductor light emitting device having one side or a diameter of several μm and may have a circular or polygonal shape as illustrated in the drawings and include a body part 310, an insulating part 320, and an electrode part 330.

The body part 310 may include a first conductivity type semiconductor layer 311, an active layer 312, and a second conductivity type semiconductor layer 313, and also, the active layer 312 is disposed on the first conductivity type semiconductor layer 311, and the second conductivity type semiconductor layer 313 is disposed on the active layer 312.

The insulating part 320 may be disposed to cover at least a side surface of the aforementioned body part 310. The side surface of the body part 310 may be a surface on which a stacked structure of the first conductivity type semiconductor layer 311, the active layer 312, and the second conductivity type semiconductor layer 313 is exposed, and the insulating layer 320 may be disposed to cover the side surface. According to the present disclosure, the side surface of the semiconductor light emitting device 300 may have an inclination and be preferably formed to have an inclination of 45 degrees to 90 degrees with respect to a direction perpendicular to the stacking direction of the body part 310. The insulating part 320 may be made of a transparent inorganic insulating material such as $SiO_2$ or $SiN_x$.

The electrode unit 330 includes a first conductivity type electrode 331 and a second conductivity type electrode 332. The first conductivity type electrode 331 is disposed to be in contact with the first conductivity type semiconductor layer 311 of the body part 310, and the second conductivity type electrode 332 is disposed to be in contact with the second conductivity type semiconductor layer 313 of the body part 310. In the embodiment of the present disclosure, the first conductivity type semiconductor layer 311 and the first conductivity type electrode 331 mean an n-type semiconductor layer and an n-type electrode, respectively, and the second conductivity type semiconductor layer 313 and the second conductive electrode 332 mean a p-type semiconductor layer and a p-type electrode, respectively. However, the opposite embodiment is also possible.

As described above, the semiconductor light emitting device 300 according to the present disclosure has a structure of a vertical type semiconductor light emitting device in which the first conductivity type electrode 331 and the second conductivity type electrode 332 are disposed on different surfaces. However, the semiconductor light emitting device 300 is distinguished from the conventional vertical type semiconductor light emitting device in that the second conductivity type electrode 332 has a modified structure as follows.

According to the present disclosure, the second conductivity type electrode 332 may include a first portion disposed on the second conductivity type semiconductor layer 313 and a second portion 332b extending from the first portion 332a to cover at least a portion of the insulating part 320. The second portion 332b may be electrically insulated from the first conductivity type semiconductor layer 311 and the active layer 312 by the insulating layer 320.

In the present disclosure, the second portion 332b may protrude more than the first conductivity type electrode 331 with respect to one side of the body part 310. In detail, the second portion 332b may extend from a side of the second conductivity type semiconductor layer 313 toward the first conductivity type semiconductor layer 311 along the side surface of the body part 310, and the second portion 332b may protrude more than the first conductivity type electrode 331 with respect to one surface of the first conductivity type semiconductor layer 311 on which the first conductivity type electrode 331 is disposed.

In addition, the second portion 332b may protrude more than the insulating part 320 with respect to one surface of the first conductivity type semiconductor layer 311 and thus may be electrically connected to a wiring electrode 420 through a bent portion 340 to be described later.

When the second portion 332b is provided to completely cover the insulating layer 320 as illustrated in FIG. 10a, the second portion 332b viewed from one side of the body part 310 may have a closed figure such as a ring shape, and when the second portion 332b is provided to cover a portion of the insulating layer 320 as illustrated in FIG. 10(b), the second portion 332b viewed from one side of the body part 310 may have an opened figure such as a pair of lines or curves facing each other.

The semiconductor light emitting device 300 according to the present disclosure may implement a structure coupled in a new manner through the second portion 332b, which will be described later.

According to the present disclosure, the first portion 332a and the second portion 332b of the second conductivity type electrode 332 are made of different materials. The first portion 332a disposed on the second conductivity type semiconductor layer 313 may be made of a transparent material to extract light generated by the semiconductor light emitting device 300. For example, the first portion 332a may be a portion corresponding to a transparent electrode such as indium tin oxide (ITO) or indium zinc oxide (IZO). The second portion 332b disposed to extend to a side surface of the body part 310 may be made of a metal material and electrically connected to the wiring electrode to serve to reflect light leaking to the side surface of the body part 310. Thus, the second portion 332b may be provided by mixing a reflective metal with a metal having a low melting point.

According to the present disclosure, the second conductivity type electrode 332 includes a connection portion 333 disposed so that the first portion 332a and the second portion 332b overlap each other at a boundary therebetween. In an embodiment, the connection portion 333 may be provided so that the second portion 332b covers a portion of a top surface of the first portion 332a. Although this structure is implemented by the manufacturing process, the second portion 332b made of the metal material having superior ductility compared to the transparent material may be disposed to cover the first portion 332a, and thus, a stepped structure without cracks may be implemented.

According to the present disclosure, the second conductivity type semiconductor layer 313 may include a first area 313a, on which the first portion 332a of the second conductivity type electrode 332 is disposed, and a second area 313b on which the insulating layer 320 is disposed. In an embodiment, the first area 313a on which the first portion 332a is disposed may be a central area of the second conductivity type semiconductor layer 313, and the second area 313b on which the insulating layer 320 is disposed may be an area surrounding the first area 313a. Thus, the insulating layer 320 may extend to the side surface of the body part 310 on the second conductivity type semiconductor layer 313.

The first portion 332a disposed on the first area 313a of the second conductivity type semiconductor layer 313 may extend to the second area 313b. In this case, the first portion 332a may be disposed to cover the insulating layer 320 disposed on the second area 313b, and the aforementioned connection portion 333 may also be disposed on the second area 313b. As described above, the structure in which the first portion 332a is disposed on the entire area of the second conductivity type semiconductor layer 313 may maximize an emission area of the semiconductor light emitting device 300.

Figure 12:
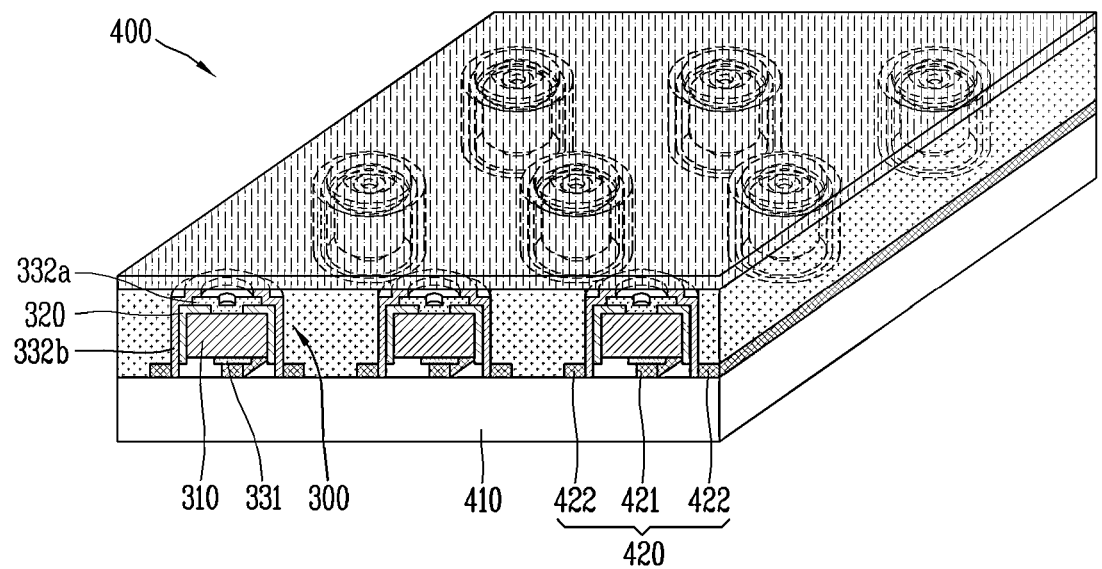
FIG. 12 is a conceptual view of a display device according to the present disclosure.
Figure 13:
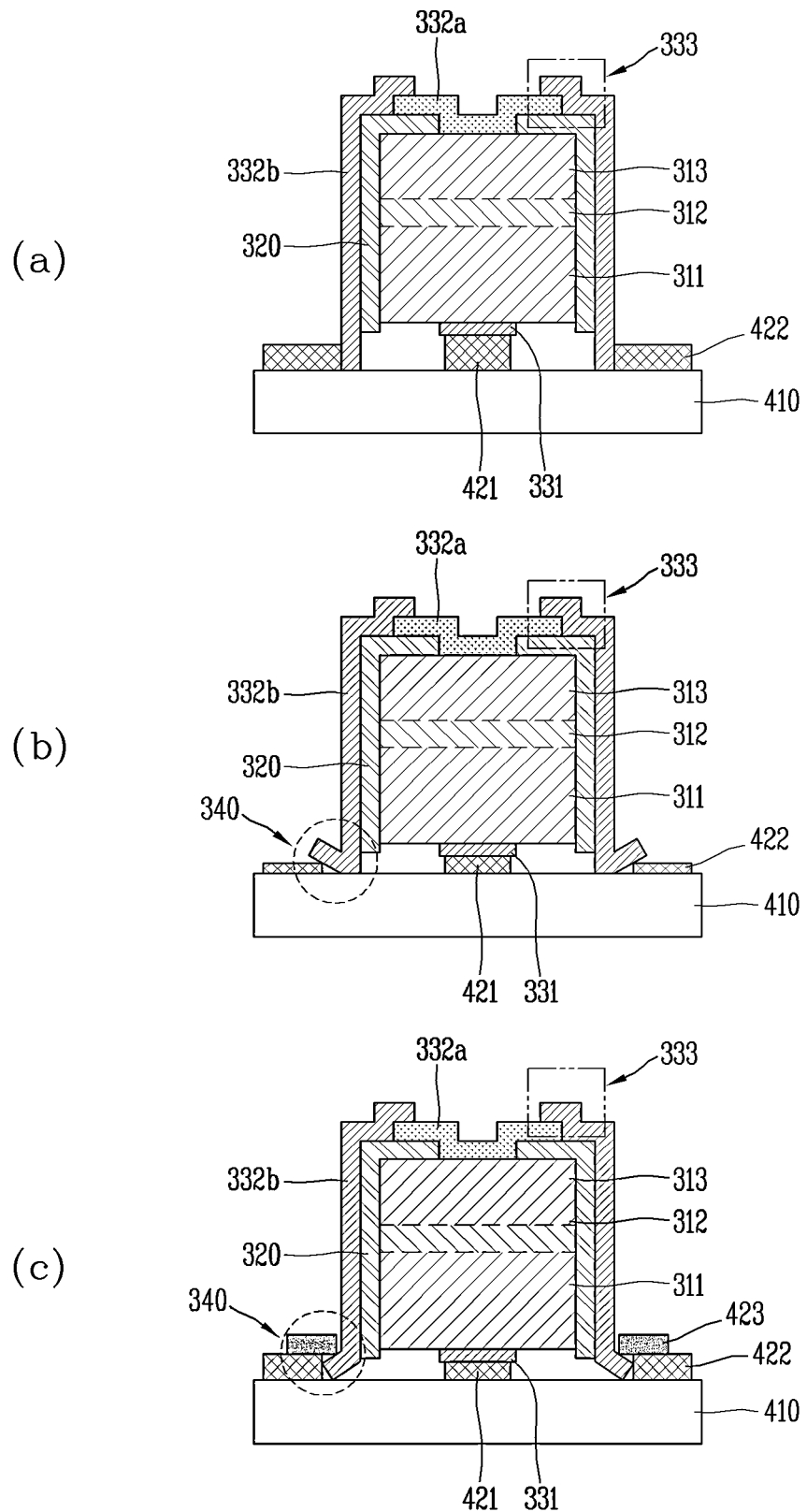
FIG. 13, including (a), (b), and (c) are conceptual views illustrating a state in which a semiconductor light emitting device is coupled to a substrate in the display device according to the present disclosure.

Hereinafter, a display device according to the present disclosure, which includes the semiconductor light emitting devices described above with reference to FIGS. 12 and 13 will be described. FIG. 12 is a conceptual view of a display device according to the present disclosure, and FIG. 13 is a conceptual view illustrating a state in which a semiconductor light emitting device is coupled to a substrate in the display device according to the present disclosure.

A display device 400 according to the present disclosure includes a substrate 410, on which a wiring electrode 420 is disposed, and semiconductor light emitting devices disposed on the substrate 410 to be electrically connected to the wiring electrode 420, and the semiconductor light emitting devices 300 may refer to the aforementioned semiconductor light emitting devices.

As described above, each of the semiconductor light emitting devices 300 is an ultra-small semiconductor light emitting device having one side or a diameter of several μm, and the description of the structure of the semiconductor light emitting device is substituted by the above description.

According to the present disclosure, the semiconductor light emitting device 300 has a structure of a vertical type semiconductor light emitting device in which the first conductivity type electrode 331 and the second conductivity type electrode 332 are disposed on different surfaces. However, the semiconductor light emitting device 300 is distinguished from the conventional vertical type semiconductor light emitting device in that the second conductivity type electrode 332 has a modified structure. In this embodiment, the second conductivity type electrode 332 may include a first portion disposed on the second conductivity type semiconductor layer 313 and a second portion 332b extending from the first portion 332a to cover at least a portion of the insulating part 320.

According to the present disclosure, the semiconductor light emitting device 300 may implement a structure coupled in a new manner through the second portion 332b. Specifically, the second portion 332b may be disposed to protrude more than the first conductivity type electrode 311 with respect to one surface of the first conductivity type semiconductor layer 311 on which the first conductivity type electrode 331 is disposed and may be electrically connected to a wiring electrode 420 of a substrate 410 through the protruding portion of the second portion 332b.

The substrate 410 includes a first wiring electrode 421 electrically connected to the first conductivity type electrode 331 and a second wiring electrode 422 electrically connected to the second conductivity type electrode 332. In the present disclosure, both the first wiring electrode 421 and the second wiring electrode 422 may be disposed on one surface of the substrate 410 and may be provided as parallel-line electrodes. Also, the second wire electrode 422 may be disposed to be spaced a predetermined distance from the first wire electrode 421 on both sides of the first wire electrode 421 (hereinafter referred to as buckle coupling).

According to the present disclosure, the second conductivity type electrode 332 of the semiconductor light emitting device 300 may be transferred onto the substrate 410 so that the protruding portion of the second portion 332b is disposed, preferably, fitted between the second wiring electrodes 422 disposed at both the sides of the first wiring electrode 421. Also, in this process, the first conductivity type electrode 331 of the semiconductor light emitting device 300 may be disposed on the second wire electrode 421 disposed between the second wire electrodes 422. That is, according to the present disclosure, the semiconductor light emitting device 300 may be transferred so that the first conductivity type electrode 331 and the second conductivity type electrode 332 are in contact with the first wiring electrode 421 and the second wiring electrode 422 at the same time. Thereafter, an electrical connection between the semiconductor light emitting device 300 and the wiring electrode 420 may be realized through thermal bonding.

In order to implement the above-described buckle coupling, a distance between the second wire electrodes 422 disposed on both the sides of the first wire electrode 421 may have a length greater than that of one side or a diameter of the semiconductor light emitting device 300. In addition, the second portion 332b may be disposed to protrude more than the first conductivity type electrode 331 by at least a thickness of the wiring electrode 420 disposed on the substrate 410 with respect to one side of the body part 310. Thus, the semiconductor light emitting devices 300 may be stably coupled to the substrate 410.

The semiconductor light emitting device 300 according to the present disclosure may further include a bent portion 340 covering a clearance between the second portion 332b and the second wiring electrode 422 as illustrated in FIGS. 13(b) and 13(c).

For example, when the semiconductor light emitting device 300 is transferred to the substrate 410, the first conductivity type electrode 331 may not be in contact with the first wiring electrode 421, or the second portion 332b of the second conductivity type electrode 332 may not be in contact with the second wiring electrode 422. Here, a portion of the second portion 332b including an end of the second portion 332b may form a bent portion 340 that is bent in a direction toward the second wiring electrode 422 to implement a structure in which the first conductive electrode 331 and the first wiring electrode 421 are in contact with each other, and the second conductivity type electrode 332 and the second wiring electrode 422 are in contact with each other.

According to the present embodiment, alignment and bonding errors of the semiconductor light emitting device 300 may be overcome through the bent portion 340, and a contact area between the second conductivity type electrode 332 and the second wiring electrode 422 may increase.

In addition, according to the present disclosure, an auxiliary electrode 423 disposed to cover the bent portion 340 so as to sufficiently secure the contact area between the second conductivity type electrode 332 and the second wiring electrode 422 may be further provided. For example, the second wiring electrode 422 may be configured as a multi-layer, and the auxiliary electrode 423 may correspond to an upper layer of the second wiring electrode configured as the multi-layer.

Next, a method of manufacturing a display device according to the present disclosure will be described with reference to FIG. 14. FIGS. 14a to 14f are views illustrating a process of manufacturing a display device according to the present disclosure.

Figure 14A:
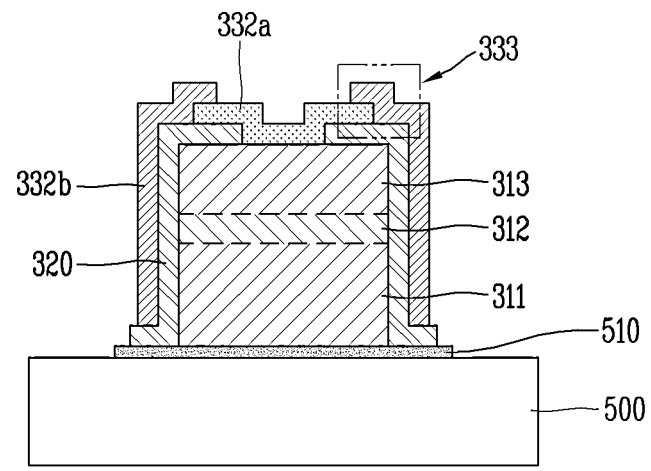
FIGS. 14a to 14f are views illustrating a process of manufacturing a display device according to the present disclosure.

First, as illustrated in FIG. 14a, a process of manufacturing a semiconductor light emitting device 300 according to the present disclosure may be performed. According to an embodiment, in order to manufacture the semiconductor light emitting device 300, a first conductivity type semiconductor layer 311, an active layer 312, and a second conductivity type semiconductor layer 313 corresponding to a body part 310 are grown on a growth substrate 500 on which a sacrificial layer is formed, and then, a plurality of semiconductor light emitting devices are formed through mesa and isolation etching. Here, the isolation etching may be performed so that a side surface of the body part 310 has an inclination.

Next, the insulating part 320 is formed on the second conductivity type semiconductor layer 313 to cover the side surface of the body part 310. For this, a process of forming a mask pattern on the second conductivity type semiconductor layer 313 may be preceded, and after forming the insulating layer 320, a mask may be removed.

Next, a process of forming the second conductivity type electrode 332 is performed. First, a first portion 332a is formed on the second conductivity type semiconductor layer 313, and then a second portion 332b extending from the first portion 332a to cover the insulating part 320 is formed. Since the first portion 332a is formed on an emission surface, the first portion 332a may be made of a transparent material, and the second portion 332b may be made of a metal material.

Figure 14B:
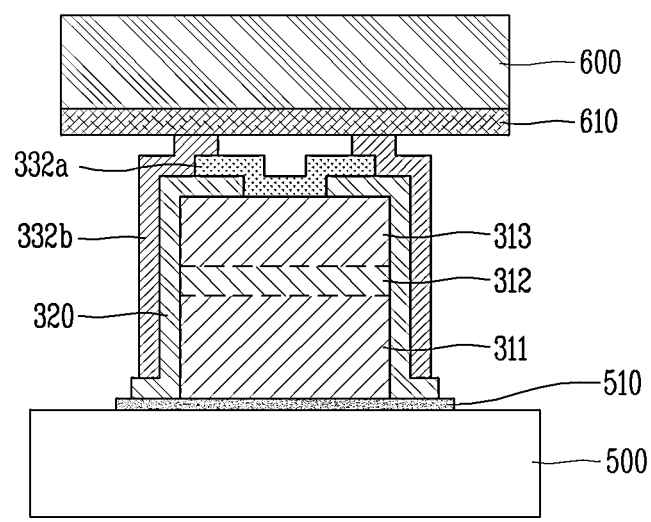
Figure 14C:
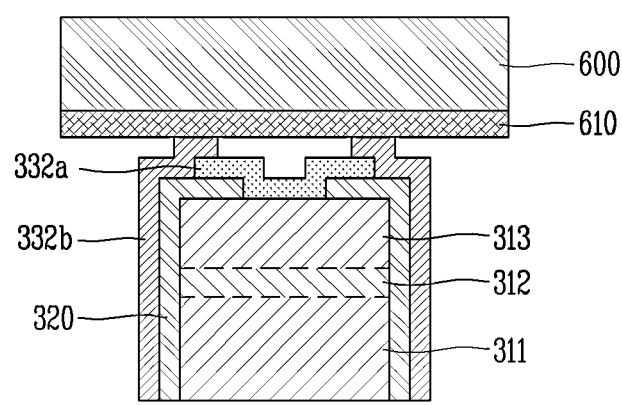

Next, as illustrated in FIG. 14b, a process of bonding a donor substrate 600 to one surface of the semiconductor light emitting device 300 is performed. The donor substrate 600 may have an adhesive layer 610 formed thereon so that the semiconductor light emitting device 300 temporarily adheres thereto. Thereafter, a process of separating the semiconductor light emitting device 300 from the growth substrate 500 is performed as illustrated in FIG. 14c. The semiconductor light emitting device 300 may be separated from the growth substrate 500 by removing the sacrificial layer 510, and in an embodiment, the sacrificial layer 510 may be removed by electrochemical etching. In the processes of FIGS. 14b and 14c, the sacrificial layer 510 may be etched first, and the semiconductor light emitting device 300 and the donor substrate 600 may be bonded to each other before the sacrificial layer 510 is completely removed.

Figure 14D:
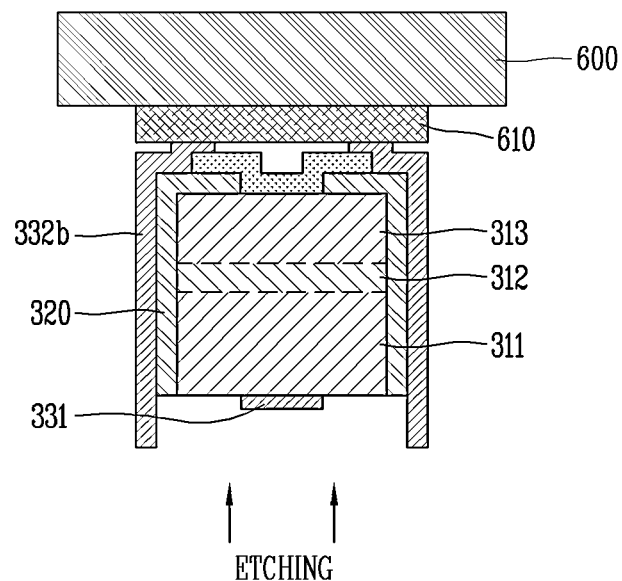

Next, as illustrated in FIG. 14d, the etching may be performed on one surface of the semiconductor light emitting device 300 separated from the growth substrate 500 (based on the drawing, a rear surface of the semiconductor light emitting device). Here, the etching may be selectively performed on the first conductivity type semiconductor layer 311 and the insulating layer 320, and thus, the second portion 332b may protrude with respect to the first conductivity type semiconductor layer 311.

When each of the first conductivity type semiconductor layer 311 and the insulating part 320 is etched to a predetermined thickness, a first conductivity type electrode 331 is formed on the first conductivity type semiconductor layer 311. The second portion 332b may have a shape that protrudes more than the first conductivity type electrode 331 with respect to the first conductivity type semiconductor layer 311 on which the first conductivity type electrode 331 is formed.

Figure 14E:
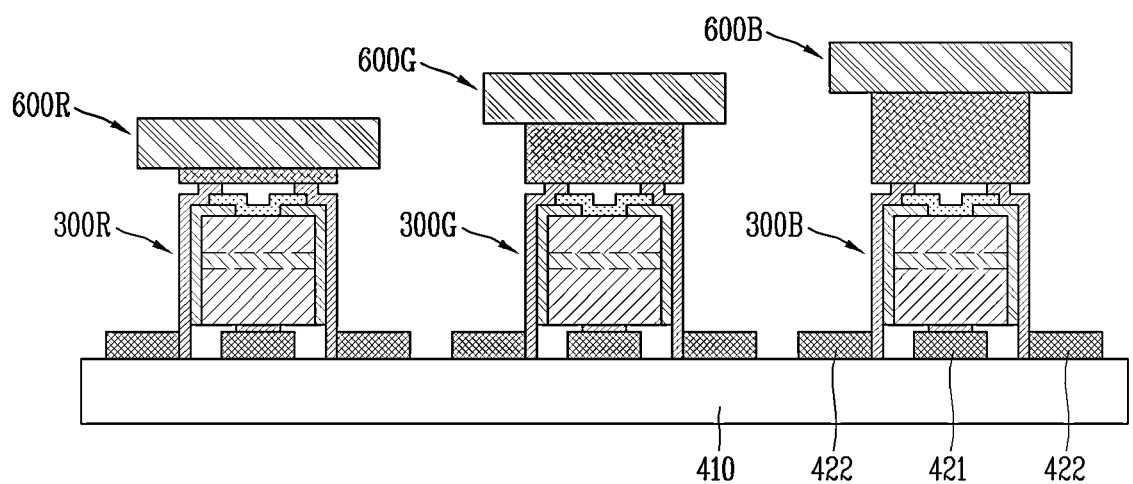

Next, as illustrated in FIG. 14E, a process of transferring the semiconductor light emitting devices 300 to the substrate 410 on which the wiring electrode 420 is formed is performed.

The substrate 410 to which the semiconductor light emitting devices 300 are transferred includes a line-shaped first wiring electrode 421 and a line-shaped second wiring electrode 422, which are arranged parallel to each other, and the second wiring electrode 422 is disposed to be spaced a predetermined distance from the first wiring electrode 421 at each of both sides of the first wiring electrode 421.

According to the present disclosure, the semiconductor light emitting devices 300 may be transferred so that the protruding portion of the second portion 332b is fitted between the second wire electrodes 422 disposed at both the sides of the first wire electrode 421. In this process, the first conductivity type electrode 331 having a height difference from the second portion 332b may be disposed on the first wire electrode 421 disposed between the second wire electrodes 422. That is, according to the present disclosure, the semiconductor light emitting devices 300 may be transferred so that the first conductivity type electrode 331 and the first wiring electrode 421 are in contact with each other, and simultaneously, the second conductivity type electrode 332 and the second wiring electrode 422 are in contact each other.

During the transfer process, there may be a case in which the first conductivity type electrode 331 and the first wiring electrode 421 are not in contact with each other, or the second conductivity type electrode 332 and the second wiring electrode 422 are not in contact with each other. In this case, the bent portion 340 may be formed by bending a portion of the protruding portion of the second portion 332b in the direction toward the second wiring electrode 422 to implement the structure in which the components are in contact with each other at the same time.

According to the present embodiment, the display device 400 may be provided as only a single type of semiconductor light emitting devices, or may be provided as different types of semiconductor light emitting devices, for example, constituted by a red semiconductor light emitting device 300R, a green light emitting device 300G, and a blue semiconductor light emitting device 300B as illustrated in FIG. 14e. In the latter case, the semiconductor light emitting devices 300 may be sequentially transferred to the substrate 410 for each type. Here, since the adhesive layer 610 of the donor substrate 600 has a thickness that varies for each type of semiconductor light emitting devices 300, the semiconductor light emitting devices 300 transferred in advance to the substrate 410 may be prevented from being separated from the adhesive layer substrate 410.

Figure 14F:
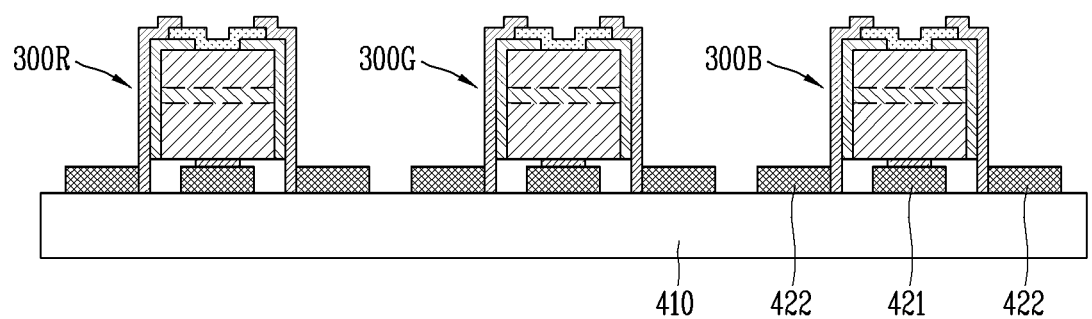

After the transfer process is completed, heat may be applied to form an electrical connection between the electrode part 330 and the wire electrode 420, which are in contact with each other, thereby manufacturing the display device 400 as illustrated in FIG. 14f.

The invention claimed is:

1. A semiconductor light emitting device comprising:
 a body part comprising a first conductivity type semiconductor layer, an active layer on the first conductivity type semiconductor layer, and a second conductivity type semiconductor layer on the active layer;
 an insulating part covering at least a side surface of the body part; and
 an electrode part comprising a first conductivity type electrode in contact with the first conductivity type semiconductor layer, and a second conductivity type electrode in contact with the second conductivity type semiconductor layer,
 wherein the second conductivity type electrode comprises:
  a first portion on the second conductivity type semiconductor layer; and
  a second portion extending from the first portion and covering at least a portion of the insulating part,
 wherein the second portion protrudes more than the first conductivity type electrode with respect to the side surface of the body part,
 wherein the first portion includes a transparent material, and
 wherein the second portion includes a metal material.

2. The semiconductor light emitting device according to claim 1, wherein the second conductivity type electrode comprises a connection portion configured so that the first portion and the second portion overlap each other at a boundary therebetween.

3. The semiconductor light emitting device according to claim 2, wherein the connection portion is configured so that the second portion covers a portion of a top surface of the first portion.

4. The semiconductor light emitting device according to claim 1, wherein the second conductivity type semiconductor layer comprises:
 a first area on which the first portion of the second conductivity type electrode is disposed; and
 a second area on which the insulating part is disposed and which surrounds the first area.

5. The semiconductor light emitting device according to claim 4, wherein the first portion extends on the insulating part disposed on the second area.

6. The semiconductor light emitting device according to claim 1, wherein the semiconductor light emitting device is a vertical type semiconductor light emitting device.

7. A display device comprising:
 a substrate comprising a wiring electrode; and
 semiconductor light emitting devices on the substrate,
 wherein each of the semiconductor light emitting devices comprises:
  a body part comprising a first conductivity type semiconductor layer, an active layer on the first conductivity type semiconductor layer, and a second conductivity type semiconductor layer on the active layer;
  an insulating part covering at least a side surface of the body part; and
  an electrode part comprising a first conductivity type electrode in contact with the first conductivity type semiconductor layer, and a second conductivity type electrode in contact with the second conductivity type semiconductor layer,
 wherein the second conductivity type electrode comprises:
  a first portion on the second conductivity type semiconductor layer; and
  a second portion extending from the first portion and covering at least a portion of the insulating part,
 wherein the second portion protrudes more than the first conductivity type electrode with respect to the side surface of the body part,
 wherein the first portion includes a transparent material, and
 wherein the second portion includes a metal material.

8. The display device according to claim 7, wherein the wiring electrode comprises:
 a first wiring electrode electrically connected to the first conductivity type electrode; and
 a second wiring electrode spaced a predetermined distance from the first wiring electrode and electrically connected to the second conductivity type electrode.

9. The display device according to claim 8, wherein the first conductivity type electrode is on the first wiring electrode, and wherein the second conductivity type electrode is provided in a pair, and is configured so that a portion of the second portion is disposed between a pair of second wiring electrodes disposed at opposite sides of the first wiring electrode.

10. The display device according to claim 9, wherein the second portion further comprises a bent portion that is bent in a direction toward at least one of the pair of second wiring electrodes.

11. The display device according to claim 10, wherein each second wiring electrode further comprises an auxiliary electrode covering the bent portion.

12. The display device according to claim 7, wherein the second portion protrudes more than the first conductivity type electrode by a thickness of at least the wiring electrode.

13. A display device comprising:
   a semiconductor light emitting device; and
   a substrate comprising first and second electrodes separated from each other and connected to the semiconductor light emitting device,
   wherein the semiconductor light emitting device comprises:
      a body comprising a first conductivity type semiconductor layer, an active layer on the first conductivity type semiconductor layer, and a second conductivity type semiconductor layer on the active layer;
      an insulating layer extending on a side surface of the body; and
      an electrode part comprising a first conductivity type electrode in contact with the first conductivity type semiconductor layer, and a second conductivity type electrode in contact with the second conductivity type semiconductor layer at a first side of the body,
   wherein the second conductivity type electrode extends along the side surface of the body towards the first side of the body where the first conductivity type electrode is located, and
   wherein the second conductivity type electrode contacts at least a side surface of the second electrode and the first conductivity type electrode contacts a top surface of the first electrode.

14. The display device according to claim 13, wherein the second conductivity type electrode comprises:
   a first portion on a second side of the body; and
   a second portion connected to the first portion and extending on the insulating layer.

15. The display device according to claim 14, wherein parts of the first portion and the second portion overlap, and wherein the first portion is transparent, and the second portion is reflective.

16. The display device according to claim 14, wherein the insulating layer is interposed between the first conductivity type electrode and the second portion of the second conductivity type electrode at the first side of the body.

\* \* \* \* \*